United States Patent
Giterman et al.

(10) Patent No.: US 9,691,445 B2
(45) Date of Patent: Jun. 27, 2017

(54) TRANSISTOR GAIN CELL WITH FEEDBACK

(71) Applicant: Bar-Ilan University, Ramat-Gan (IL)

(72) Inventors: Robert Giterman, Beer-Sheva (IL); Adam Teman, Lausanne (CH); Pascal Meinerzhagen, Hillsboro, OR (US); Andreas Burg, Ecublens (CH); Alexander Fish, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 0 days.

(21) Appl. No.: 15/306,796

(22) PCT Filed: Apr. 30, 2015

(86) PCT No.: PCT/IL2015/050452
§ 371 (c)(1),
(2) Date: Oct. 26, 2016

(87) PCT Pub. No.: WO2015/166500
PCT Pub. Date: Nov. 5, 2015

(65) Prior Publication Data
US 2017/0062024 A1  Mar. 2, 2017

Related U.S. Application Data

(60) Provisional application No. 61/986,915, filed on May 1, 2014.

(51) Int. Cl.
*G11C 5/06* (2006.01)
*G11C 7/10* (2006.01)
(Continued)

(52) U.S. Cl.
CPC ............. *G11C 7/10* (2013.01); *G11C 5/025* (2013.01); *G11C 5/06* (2013.01); *G11C 11/4097* (2013.01);
(Continued)

(58) Field of Classification Search
CPC .. G11C 7/10; G11C 5/06; G11C 5/025; G11C 11/4097; G11C 11/412; H01L 27/11; H01L 27/1104
(Continued)

(56) References Cited

U.S. PATENT DOCUMENTS 6,246,083 B1 * 6/2001 Noble ............... H01L 27/108
257/296
6,747,890 B1 * 6/2004 Kirihata ............ H01L 27/108
257/E21.646
(Continued)

FOREIGN PATENT DOCUMENTS

WO  WO 2005/064615  7/2005
WO  WO 2015/166500  11/2015

OTHER PUBLICATIONS

International Preliminary Report on Patentability Dated Nov. 10, 2016 From the International Bureau of WIPO Re. Application No. PCT/IL2015/050452. (5 Pages).
(Continued)

*Primary Examiner* — Pho M Luu (57) ABSTRACT

A gain cell includes a write bit line input, a read bit line output, a write trigger input and a read trigger input. The gain cell also includes a write transistor, retention element and read transistor. Each of the transistors includes a respective first diffusion connection, gate connection and second diffusion connection. The write transistor first diffusion connection is connected to the write bit line input and the write transistor gate connection is connected to the write trigger input. The read transistor first diffusion connection being connected to the read bit line output and the second diffusion connection is connected to the read trigger input. The retention element buffers between write transistor and the read transistor during data retention. The retention element also connects or disconnects a write transistor diffusion connection to/from a constant voltage in accordance with a retained data level at the read transistor gate connection.

14 Claims, 10 Drawing Sheets

(51) Int. Cl.
*G11C 11/4097* (2006.01)
*G11C 11/412* (2006.01)
*G11C 5/02* (2006.01)
*H01L 27/11* (2006.01)

(52) U.S. Cl.
CPC ............ *G11C 11/412* (2013.01); *H01L 27/11* (2013.01); *H01L 27/1104* (2013.01)

(58) Field of Classification Search
USPC ......................................................... 365/72
See application file for complete search history.

(56) References Cited

U.S. PATENT DOCUMENTS

| | | | |
|---|---|---|---|
| 6,831,866 B1 | 12/2004 | Kirihata | |
| 6,845,059 B1* | 1/2005 | Wordeman | G11C 11/40603 365/156 |
| 7,120,072 B2* | 10/2006 | Ye | G11C 11/405 365/189.11 |
| 2011/0103137 A1 | 5/2011 | Beat | |

OTHER PUBLICATIONS

International Search Report and the Written Opinion Dated Aug. 12, 2015 From the International Searching Authority Re. Application No. PCT/IL2015/050452.

Chun et al. "A Sub-0.9V Logic-Compatible Embedded DRAM with Boosted 3T Gain Cell, Regulated Bit-line Write Scheme and PVT-Tracking Read Reference Bias", Symposium on VLSI Circuits Digest of Technical Papers, pp. 134-135, 2009.

Chun et al. "A 2T1C Embedded DRAM Macro with No Boosted Supplies Featuring a 7T SRAM Based Repair and a Cell Storage Monitor," IEEE Journal of Solid-State Circuits, 47(10): 2517-2526, 2012.

Chun et al. "A 667 MHz Logic-Compatible Embedded DRAM Featuring an Asymmetric 2T Gain Cell for High Speed On-Die Caches," IEEE JSSC, 47(2): 547-559, 2012.

Giterman et al. "4T Gain-Cell with Internal-Feedback for Ultra-Low Retention Power at Scaled CMOS Nodes", IEEE International Symposium on Circuits and Systems (ISCAS): 2177-2180, Jun. 1-5, 2014.

ITRS "International Technology Roadmap for Semiconductors—2012 Update", 76 pages, 2012. Available online at www.itrs.net.

Lee et al. "A 5.4nW/kB Retention Power Logic-Compatible Embedded DRAM with 2T Dual-VT Gain Cell for Low Power Sensing Applications," IEEE Asian Solid-State Circuits Conference, Nov. 8-10, 2010, Beijing, China: 4 pages.

Meinerzhagen et al. "Exploration of Sub-VT and Near-VT 2T Gain-Cell Memories for Ultra-Low Power Applications Under Technology Scaling," Journal of Low Power Electronics and Applications, 3(2): 54-72, 2013.

Somasekhar et al. "2 GHz 2 Mb 2T Gain Cell Memory Macro with 128 GBytes/sec Bandwidth in a 65 nm Logic Process Technology," IEEE JSSC, 44(1): 174-185, 2009.

Teman et al. "Review and Classification of Gain Cell eDRAM Implementations", IEEE 27th Convention of Electrical and Electronics Engineers in Israel, Nov. 17, 2012.

Zhang et al. "A 3-GHz 70Mb Sram in 65nm Cmos Technology with Integrated Column-Based Dynamic Power Supply," IEEE Journal of Solid-State Circuits, 41(1): 146-151, 2006.

\* cited by examiner

TRANSISTOR GAIN CELL WITH FEEDBACK

RELATED APPLICATIONS

This application is a National Phase of PCT Patent Application No. PCT/IL2015/050452 having International filing date of Apr. 30, 2015, which claims the benefit of priority under 35 USC §119(e) of U.S. Provisional Patent Application No. 61/986,915 filed on May 1, 2014. The contents of the above applications are all incorporated by reference as if fully set forth herein in their entirety.

FIELD AND BACKGROUND OF THE INVENTION

The present invention, in some embodiments thereof, relates to a gain cell with internal feedback and, more particularly, but not exclusively, to a four-transistor gain cell with internal feedback.

Modern microprocessors and other VLSI systems-on-chip (SoCs) implemented in aggressively scaled CMOS technologies are characterized by high leakage currents, and require an increasing amount of embedded memory [ref. 1]. Such embedded memory, typically implemented as 6-transistor (6T)-bitcell SRAM macrocells, not only consume an ever growing share of the total silicon area but also significantly contributes to the leakage power of the system. (The leakage power is a large share of the total power budget in deeply scaled CMOS nodes.) Unfortunately, besides several advantages like fast access speed and robust, static data retention, the 6T SRAM bitcell is relatively large, exhibits several leakage paths, and has dramatically increased failure rates under voltage scaling.

Gain-Cell embedded DRAM (GC-eDRAM) [refs. 2-5] circumvents the limitations of SRAM while remaining fully compatible with standard digital CMOS technologies. Furthermore, GC-eDRAMs exhibit low static leakage currents, are suitable for 2-port memory implementations, and provide non-ratioed circuit operation. The main drawback of GC-eDRAMs is the need for periodic, power-hungry refresh cycles to ensure data retention.

The Data Retention Time (DRT) of GC-eDRAMs is the maximum time interval from writing a data level into the bitcell to still being able to correctly read out the written level. The DRT is primarily limited by the level set by the initial charge stored in the bitcell and the leakage currents that degrade this level. Gain cell implementations in mature technology nodes, such as 180 nm, have been shown to exhibit high DRTs of tens to hundreds of milliseconds [ref. 4,5]. However conventional 2T gain cells in newer technology nodes, such as 65 nm, display much lower DRTs of only tens of microseconds [ref. 6]. The lower DRT is a direct consequence of the substantially higher leakage currents which result in a much faster deterioration of the stored levels [ref. 5]. Depending on the type of write transistor (WT), one of the data levels has a much higher retention time than the other (e.g. data '1' for a PMOS WT and data '0' for a NMOS WT) [ref. 6]. However, when determining the refresh frequency, one must consider the deterioration of the weaker data level under worst-case conditions, i.e. when the write bitline (WBL) is driven to the opposite level of the stored data during retention periods.

SUMMARY OF THE INVENTION

Embodiments herein present a four-transistor gain cell, optionally for use in scaled CMOS nodes characterized by high leakage currents. The gain cell protects the "weak" data level with relatively fast decay by a conditional, cell-internal feedback path. The feedback is disabled for the "strong" data level with relatively slow decay.

The feedback path is optionally implemented by a retention element which includes two switching elements. One switching element is controlled by the write line trigger to provide a buffer effect between the write and read transistors during data retention (standby). The second switching element opens a path to a constant voltage (or ground) when the "weak" data level is retained at the storage node.

According to an aspect of some embodiments of the present invention there is provided a gain cell which includes:

A) a write bit line input;
B) a read bit line output;
C) a write trigger input;
D) a read trigger input;
E) a write transistor, which includes a first diffusion connection, a gate connection, and a second diffusion connection. The first diffusion connection is connected to the write bit line input and the gate connection is connected to the write trigger input;
F) a read transistor, which includes a first diffusion connection, a gate connection and a second diffusion connection. The first diffusion connection is connected to the read bit line output and the second diffusion connection is connected to the read trigger input; and
G) a retention element associated with the write transistor and the read transistor.

The retention element buffers between the second diffusion connection of the write transistor and the gate connection of the read transistor during data retention, connects the second diffusion connection of the write transistor to a constant voltage during retention of a first data level at the gate connection of the read transistor, and disconnects the second diffusion connection of the write transistor from the constant voltage during retention of a second data level at the gate connection of the read transistor.

According to some embodiments of the invention, wherein the retention element connects the second diffusion connection of the write transistor to the gate connection of the read transistor during a write bit operation, and disconnects the second diffusion connection of the write transistor from the gate connection of the read transistor during data retention.

According to some embodiments of the invention, the retention element includes:

A) a buffer switch, having a buffer input, a buffer output and a buffer control input; and
B) a feedback switch associated with the buffer switch, having a feedback input, a feedback output and a feedback control input, wherein the feedback input is connected to a constant voltage.

The buffer input is connected to the second diffusion connection of the write transistor and to the feedback switch output. The buffer switch output is connected to the gate connection of the read transistor and to the feedback control input, and the write control input is connected to the write trigger input. The buffer switch connects the buffer input to the buffer output when the write trigger is on and disconnects the buffer input from the buffer output when the write trigger is off. The feedback switch connects the feedback input to the feedback output when the feedback control input is at the first data level and disconnects the feedback input from the feedback output when the feedback control input is at the second data level.

According to some embodiments of the invention, the retention element includes:

A) a buffer transistor, having a first diffusion connection, a gate connection connected to the write trigger input, and a second diffusion connection; and B) a feedback transistor, having a first diffusion connection, a gate connection, and a second diffusion connection, wherein the first diffusion connection is connected to a constant voltage.

The first diffusion connection of the buffer transistor is connected to the second diffusion connection of the write transistor and to the second diffusion connection of the feedback transistor. The second diffusion connection of the buffer transistor is connected to the gate connection of the read transistor and to the gate connection of the feedback transistor.

According to some embodiments of the invention, the feedback transistor is a p-type transistor and the constant voltage is a low data voltage level.

According to some embodiments of the invention, the feedback transistor is an n-type transistor and the constant voltage is a high data voltage level.

According to some embodiments of the invention, the gain cell further includes a capacitor between the gate connection of the read transistor and ground.

According to an aspect of some embodiments of the present invention there is provided a memory array which includes a plurality of gain cells as embodied herein. Respective write bit lines inputs of the gain cells are connected to form a common write bit line, and respective read bit line outputs of the gain cells are connected to form a common read bit line output.

According to an aspect of some embodiments of the present invention there is provided a gain cell which includes:

A) a write bit line input;
B) a read bit line output;
C) a write trigger input;
D) a read trigger input;
E) a write transistor, comprising a first diffusion connection, a gate connection, and a second diffusion connection. The first diffusion connection is connected to the write bit line input and the gate connection is connected to the write trigger input;
F) a read transistor, comprising a first diffusion connection, a gate connection and a second diffusion connection, the first diffusion connection is connected to the read bit line output and the second diffusion connection is connected to the read trigger input;
G) a buffer transistor, having a first diffusion connection, a gate connection connected to the write trigger input, and a second diffusion connection; and
H) a feedback transistor, having a first diffusion connection, a gate connection, and a second diffusion connection, wherein the first diffusion connection is connected to a constant voltage;

The first diffusion connection of the buffer transistor is connected to the second diffusion connection of the write transistor and to the second diffusion connection of the feedback transistor. The second diffusion connection of the buffer transistor is connected to the gate connection of the read transistor and to the gate connection of the feedback transistor.

According to some embodiments of the invention, the write transistor, the buffer transistor the feedback transistor and the read transistor are p-type transistors.

According to some embodiments of the invention, the write transistor, the buffer transistor, the feedback transistor and the read transistor are n-type transistors.

According to some embodiments of the invention, the write transistor, the buffer transistor and the feedback transistor are p-type transistors and the read transistor is an n-type transistor.

According to some embodiments of the invention, the write transistor, the buffer transistor and the feedback transistor are n-type transistors and the read transistor is a p-type transistor.

According to an aspect of some embodiments of the present invention there is provided a memory array which includes a plurality of gain cells as embodied herein. Respective write bit line inputs of the gain cells are connected to form a common write bit line input, and respective read bit line outputs of the gain cells are connected to form a common read bit line output.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to a gain cell with internal feedback and, more particularly, but not exclusively, to a four-transistor gain cell with internal feedback.

Embodiments herein present a gain cell that selectively protects a weaker data level by means of a feedback loop. The feedback loop decreases the required refresh frequency and reduces refresh power consumption.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1A:
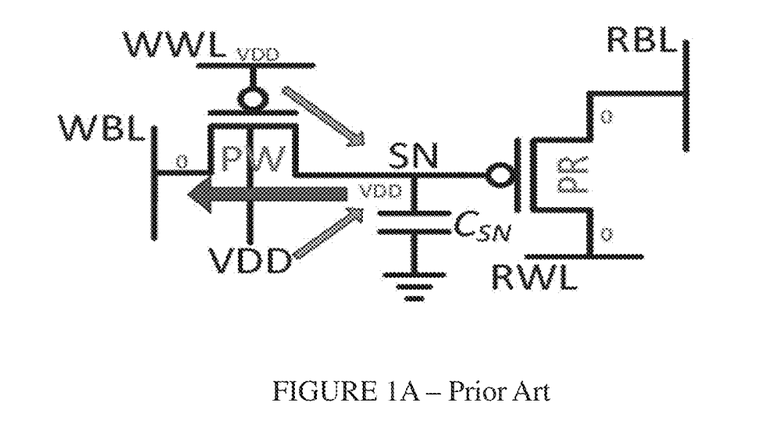
FIGS. 1A and 1B illustrate a prior art 2T PMOS gain cell during retention of a high data level and a low data level respectively.
Figure 1B:
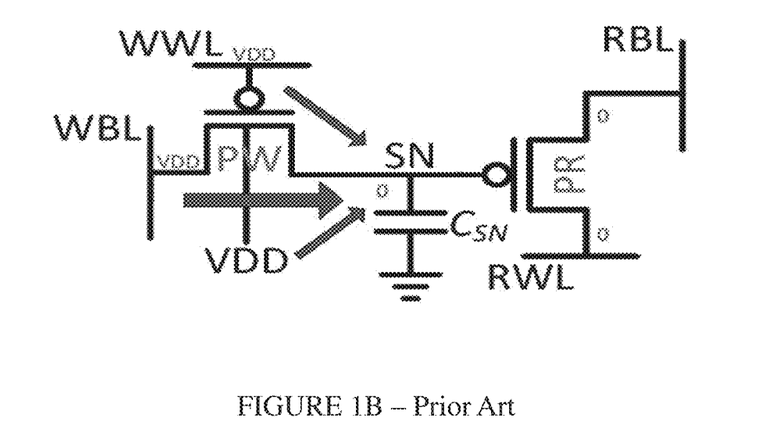

Referring now to the drawings, FIGS. 1A and 1B illustrate a prior art 2T all-PMOS gain cell during retention of a high data level and a low data level respectively. The PMOS 2T gain cell [ref. 2] is composed of a write transistor (PW), a read transistor (PR), and a storage node (SN). This circuit displays asymmetric retention characteristics with highly advantageous retention of data '1' over data '0'. The worst-case biasing during retention of a '1' occurs when write bitline (WBL) is grounded and subthreshold (sub-$V_T$) leakage discharges SN, as illustrated in FIG. 1A. However, as the stored level decays to $V_{DD}$-Δ, the overdrive of PW ($V_{SG}$-|$V_{Tp}$|) becomes increasingly negative and simultaneously the device becomes reverse body biased. Therefore, the sub-$V_T$ leakage is strongly suppressed and the stored level decays very slowly. On the other hand, when a '0' is stored in the cell and WBL is driven to $V_{DD}$, as illustrated in FIG. 1B, this self-limitation does not occur and the leakage currents gradually charge SN until the data level is lost.

Figure 2:
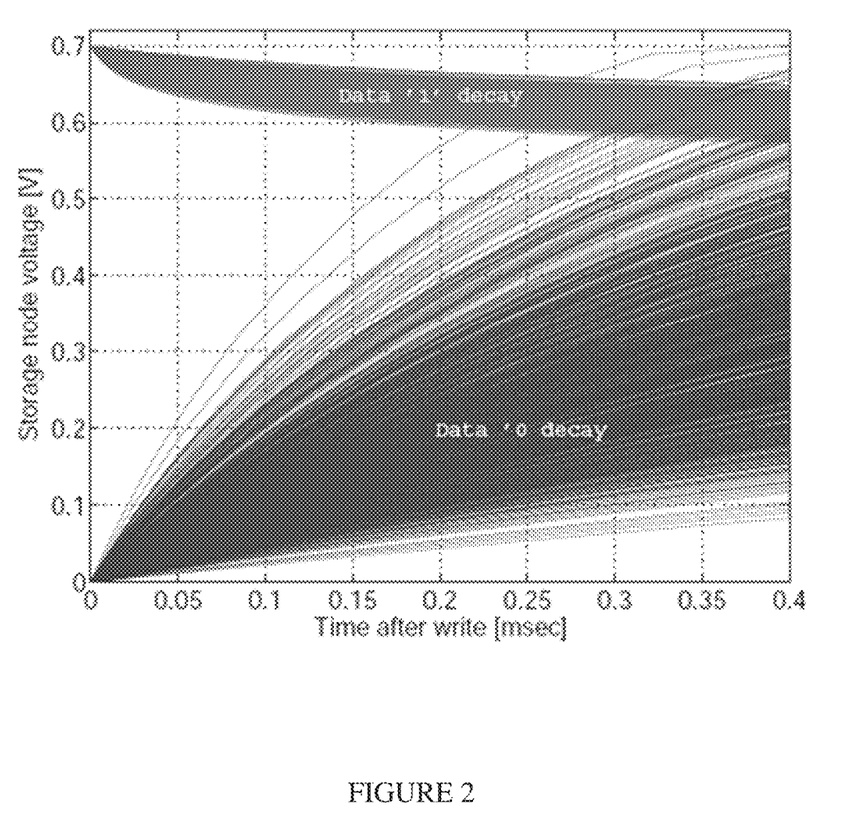
FIG. 2 shows storage node degradation of a prior art 2T PMOS gain cell following a write operation under the two worst-case biasing situations.

Reference is now made to FIG. 2, which presents simulation results of storage node degradation for a PMOS 2T gain cell following a write operation under the two worst-case biasing situations. The data shown in FIG. 2 was obtained from 1024 Monte Carlo simulations. FIG. 2 shows the superiority of the data '1' level in the PMOS 2T gain cell relative to the data '0' level. FIG. 2 also demonstrates the degraded retention times at scaled technologies, with an estimated DRT of only approximately 200 μs, measured at the earliest intersection between the '0' and '1' samples. Note that FIG. 2 presents a representative estimation of DRT for the purpose of illustrating the principle of data level decay. For full DRT measurement, the array architecture and the read scheme should be taken into account [ref. 6].

Embodiments herein diminish the worse-case data level decay by inserting retention element between the read and write transistors. The retention element forms a buffer node (BN) within the gain cell, and provides a feedback effect which maintains the voltage level at BN when the "weak" data level is being retained at SN.

Figure 3:
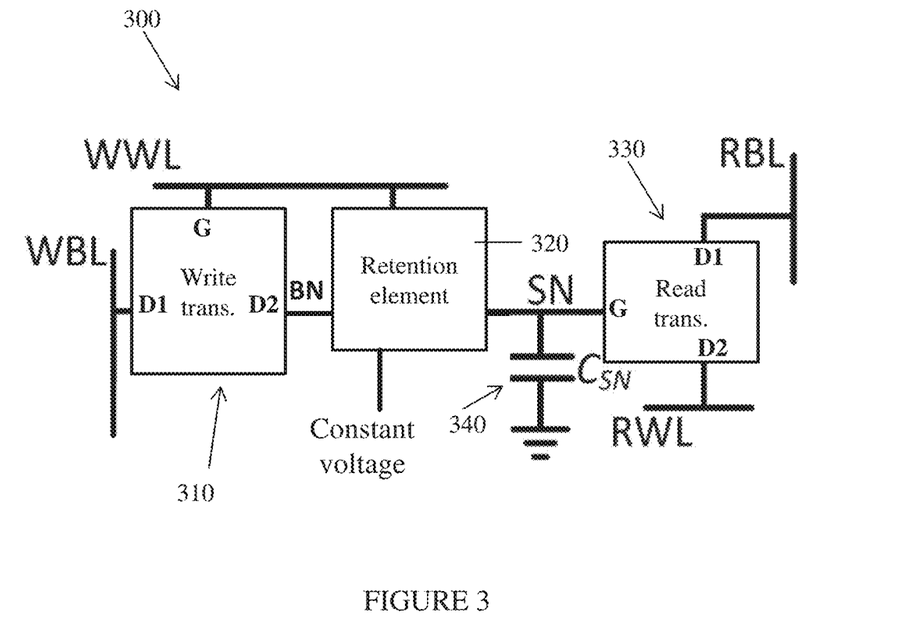
FIG. 3 is a simplified block diagram of a gain cell, according to embodiments of the invention.

Reference is now made to FIG. 3, which is a simplified block diagram of a gain cell, according to embodiments of the invention. Gain cell 300 includes write transistor 310, retention element 320 and read transistor 330.

As shown in FIG. 3, the D1 diffusion input of write transistor 310 is connected to the write bit line (WBL) and the gate G is connected to write line (WWL). WWL serves as a write trigger similarly its function in the 2T gain cell. Diffusion connection D1 of read transistor 330 connects to the read bit line output (RBL) and diffusion connection D2 of read transistor 330 connects to the read trigger line (also denoted herein RWL and read word line).

Retention element 320 is connected between the write transistor D2 diffusion connection and the gate of read transistor 330. A buffer node (BN) is formed between retention element 320 and the write transistor D2 diffusion connection. Retention element 320 also connects to a constant voltage, which may be a low data level (or ground) or a high data level depending on the transistor type as described below.

Retention element 320 serves a dual purpose:

A) Retention element 320 connects and disconnects the buffer node (BN) and the storage node (SN), based on the state of WWL. During write operations, retention element 310 connects BN and SN so that the voltage levels at both nodes are equal. During voltage retention (e.g. standby), retention element 310 disconnects BN from SN.

B) Retention element 320 also provides a feedback mechanism which is controlled by the voltage level at SN during voltage retention. During one logic state (the "weak" state) the write transistor diffusion connection D2 is connected to the constant voltage, which slows the decay of the voltage level at BN. During the opposite logic state (the "strong" state) the write transistor diffusion connection D2 is disconnected from the constant voltage, and the voltage at BN decays relatively slowly due to self-limiting effects (similarly to the 2T gain cell).

Optionally, gain cell 300 further includes capacitor $C_{SN}$ 340, between SN and ground.

Figure 4:
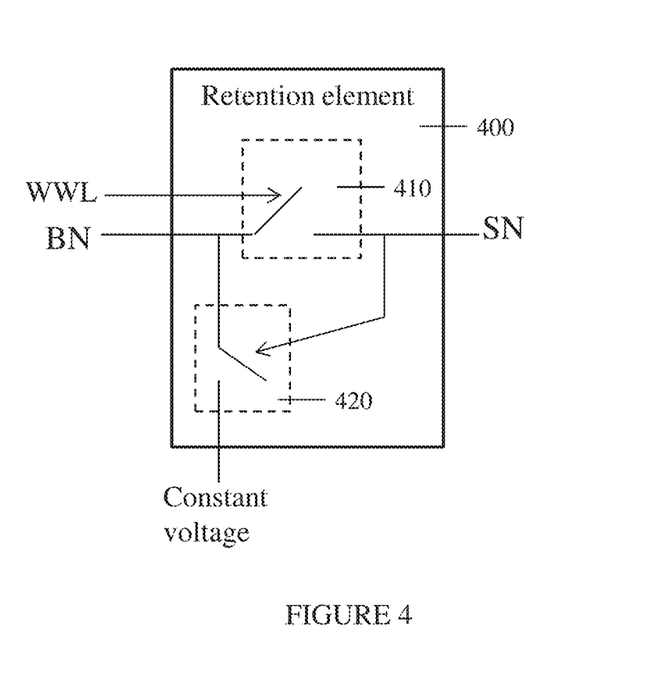
FIG. 4 is a simplified block diagram of a retention element, according to embodiments of the invention.

Reference is now made to FIG. 4, which is a simplified block diagram of a retention element, according to embodiments of the invention. Reference element 400 includes two switching elements, 410 and 420. Switch 410 connects and disconnects BN and SN according to the WWL level. Switch 420 connects and disconnects BN from the constant voltage according to the voltage level at SN. Optionally, switches 410 and 420 operate in a complementary manner, meaning that when one of the switches is "on" the other switch is "off" and vice versa.

Optionally, one or both of switching elements 410 and 420 are transistors, with the control signal input (e.g. WWL and/or SN level) being input to the respective transistor gate. This yields a four transistor gain cell (denoted a 4T gain cell), exemplary embodiments of which are described below (see FIGS. 5 to 8).

Four-Transistor (4T) Gain Cell

Embodiments herein present a four-transistor gain cell that utilizes an internal feedback mechanism to significantly increase the data retention time in scaled CMOS technologies. The resulting gain cell displays a large reduction in retention power, with a reduction in bitcell area (as compared to a standard 6T SRAM).

Figure 5:
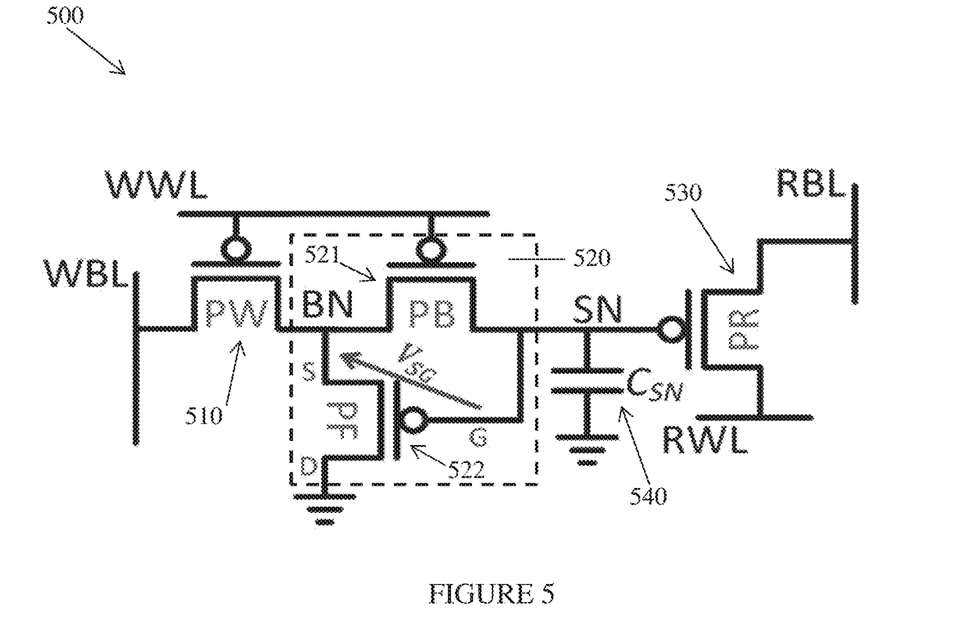
FIG. 5 is a simplified diagram of a gain cell which includes four p-type transistors, according to embodiments of the invention.

Reference is now made to FIG. 5, which is a simplified diagram of a four-transistor gain cell, according to embodiments of the invention. 4T gain cell 500 (also denoted herein a 4T PMOS gain cell) includes four p-type transistors, and optionally capacitor $C_{SN}$ 540.

In gain cell 500, WBL connects to a diffusion connection write transistor 510 (PW). Feedback transistor 522 (PF) and buffer transistor 521 (PB) together serve as a retention element 520 between storage node SN and write transistor 510 (PW). Gain cell 500 includes two nodes, buffer node BN (at the junction of PW 510, PB 521 and PF 522) and storage node SN (at the junction of PB 520, PF 522, $C_{SN}$ 540 and PR 530). Feedback transistor 522 (PF) conditionally discharges the BN node according to level at the SN node. Buffer transistor 522 separates the stored data level at SN from the BN level to ensure extended retention time. The gate of read transistor 530 (PR) connects to SN. Stored data is read at the read bit line output (RBL).

Figure 6:
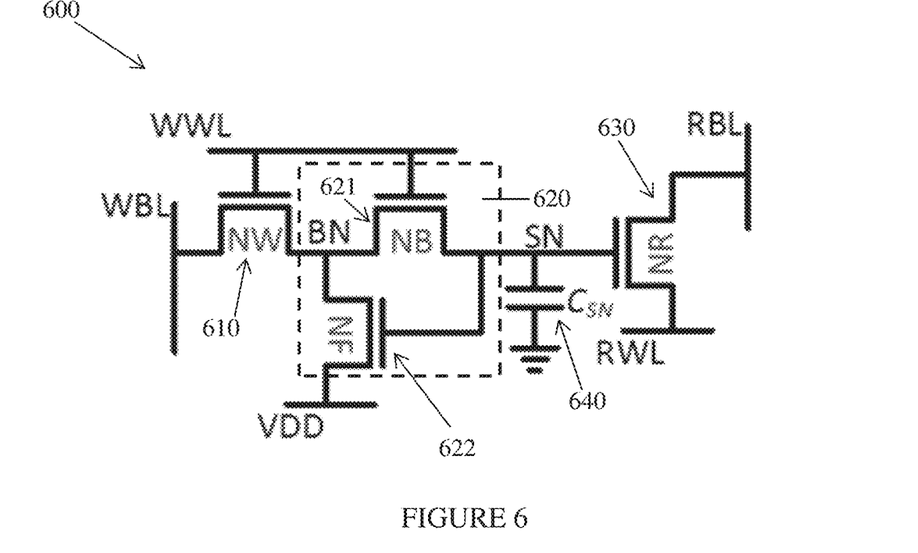
FIG. 6 is a simplified diagram of a gain cell which includes four n-type transistors, according to embodiments of the invention.
Figure 7:
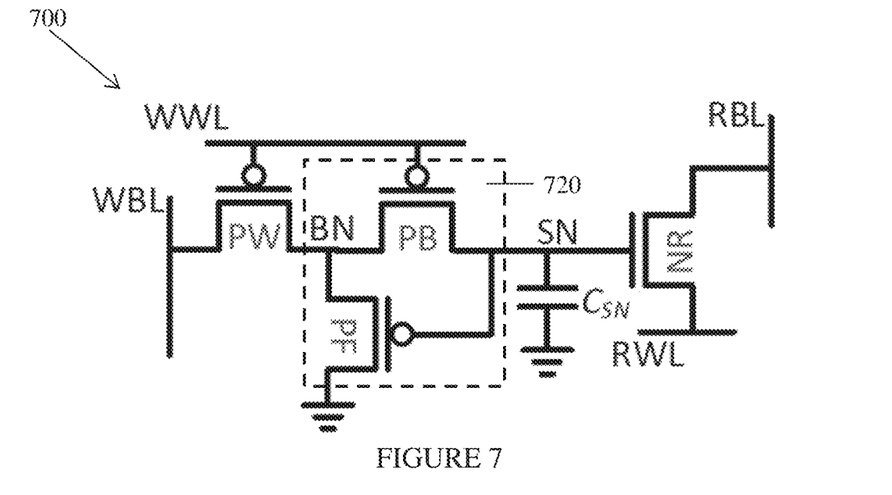
FIG. 7 is a simplified diagram of a gain cell which includes three p-type transistors and one n-type transistor, according to embodiments of the invention.
Figure 8:
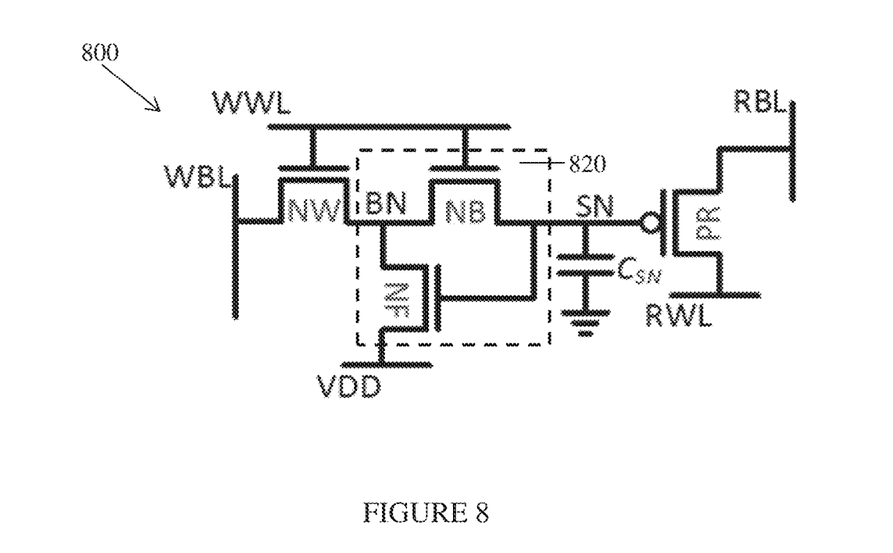
FIG. 8 is a simplified diagram of a gain cell which includes three n-type transistors and one p-type transistor, according to embodiments of the invention.

In the embodiment of a 4T gain cell of FIG. 5 all four transistors are p-type. Other combinations of transistor types may be used. Optional combinations of transistor types for a 4T gain cell include:

A) Write transistor, feedback transistor, buffer transistor and read transistor are all p-type transistors;

B) Write transistor, feedback transistor, buffer transistor and read transistor are all n-type transistors (e.g. FIG. 6);

C) Write transistor, feedback transistor, buffer transistor are p-type transistors, and the read transistor is n-type (e.g. FIG. 7); and D) Write transistor, feedback transistor and buffer transistor are n-type transistors, and the read transistor is p-type (see FIG. 8).

When the 4T gain cell includes n-type transistors and the voltage levels and cell operation are adapted to the transistor type, as known in the art.

Optionally, gain cell 500 includes four standard threshold-voltage ($V_T$) transistors and is fully compatible with standard CMOS processes. In some embodiments, PMOS transistors are used. PMOS transistors have lower sub-$V_T$ and gate leakages relative to NMOS transistor, which may provide longer retention times while maintaining a small cell area. Detailed cell operation is explained hereafter.

In some embodiments, all of the transistors in gain cell 500 are of the same type. In other embodiments, not all of the transistors in gain cell 500 are of the same type, but rather each transistor is implemented in a respective type which may vary.

A non-limiting list of transistor types which may be included in gain cell 500 includes:
A) High-VT;
B) Low-VT;
C) Standard-VT; and
D) "IO" transistors.

Reference is now made to FIG. 6, which is a simplified diagram of a four-transistor gain cell, according to embodiments of the invention. 4T gain cell 600 includes four n-type transistors, and optionally capacitor $C_{SN}$ 640. Write transistor (NW) 610, feedback transistor (NF) 622, buffer transistor (NB) 621 and read transistor (NR) 630 are connected similarly to the p-type embodiment of FIG. 5. Feedback transistor 622 (NF) and buffer transistor 621 (NB) together serve as a retention element 620 between storage node SN and write transistor 610 (NW). However the constant voltage input into feedback transistor 622 is $V_{DD}$, as required for n-type transistor operation. During the read operation the RBL is pre-charged and RWL is discharged (in contrast with the p-type transistor embodiment of FIG. 5, in which during the read operation RBL is pre-discharged and RWL is charged (see FIG. 10).

Reference is now made to FIG. 7, which is a simplified diagram of a four-transistor gain cell, according to embodiments of the invention. 4T gain cell 700 includes three p-type transistors (PW, PB and PF), and optionally capacitor $C_{SN}$. Read transistor (NR) is n-type. Write transistor PW, feedback transistor PW, buffer transistor PB and read transistor NR are connected similarly to the four p-type embodiment of FIG. 5. Feedback transistor PF and buffer transistor PB together serve as a retention element 720 between storage node SN and write transistor PW. Feedback transistor PF and buffer transistor PB together serve as a retention element between storage node SN and write transistor PW. The constant voltage input into feedback transistor PF is connected to ground.

Reference is now made to FIG. 8, which is a simplified diagram of a four-transistor gain cell, according to embodiments of the invention. 4T gain cell 800 includes three n-type transistors (NW, NB and NF), and optionally capacitor $C_{SN}$. Read transistor (PR) is p-type. Write transistor NW, feedback transistor NW, buffer transistor NB and read transistor PR are connected similarly to the four n-type embodiment of FIG. 6. Feedback transistor NF and buffer transistor NB together serve as a retention element 820 between storage node SN and write transistor PW. Feedback transistor PF and buffer transistor PB together serve as a retention element between storage node SN and write transistor NW. The constant voltage input into feedback transistor NF is connected to $V_{DD}$.

PMOS Four-Transistor (4T) Gain Cell

The operation of a 4T gain cell is described for a non-limiting all-PMOS gain cell configured as shown in FIG. 5. Write transistor 510 (PW), buffer transistor 521 (PB), feedback transistor 522 (PF) and read transistor 540 (PR) are all PMOS transistors.

Cell access is achieved in a similar fashion as with the PMOS 2T gain cell of FIGS. 1A and 1B. During writes, the write word line (WWL), which is connected to the gates of both PW 510 and PB 521, is pulsed to a negative voltage in order to enable a full discharge of SN (when writing a '0'). Readout is performed by pre-discharging the read bit line (RBL) to ground and subsequently charging the read word line (RWL) to $V_{DD}$. RBL is then conditionally charged if the storage node is low, and otherwise remains discharged. Optionally, a simple sense inverter is used on the readout path to save area and power. In additional or alternate embodiments, other conventional sense amplifiers are used for improved read performance.

The increased retention time of 4T gain cell 500 occurs during standby periods, when the internal feedback mechanisms come into play. During hold, PW 510 and PB 521 are off (WWL=$V_{DD}$), and worst-case retention conditions are assumed, i.e., that WBL is driven to the opposite voltage of the stored data level. For a stored data '1' (i.e. high data level), a self-limiting mechanism, similar to that of the 2T gain cell of FIGS. 1A and 1B, ensures that the level decays only slowly. In addition, the transistor stack (PW 510 and PB 521) provides resistance between SN and WBL and further lowering leakage and resulting in a slower decay compared to the 2T gain cell. For data '1', PF 522 is in deep cutoff, such that its effect on the circuit is almost negligible. However, following a write '0' (i.e. low data level) operation, $V_{SG}$ of PF 522 is equal to the voltage at BN ($V_{BN}$). This is much higher than the negative $V_{SG}$ of PB 521, and therefore any charge that leaks through PW 510 to BN will be discharged through PF 522 and not degrade the '0' level at SN. In this way, the worst-case condition of the 2T cell is eliminated and retention time is significantly increased.

In summary, the feedback path protects the weak '0' level on the SN by pulling BN to ground, while the worst-case $V_{DD}$ drop across PW 510 and the corresponding sub-$V_T$ leakage do not affect the retention time of the cell; the feedback path is disabled for the strong '1' level. Note that the proposed technique does not fully avoid the decay of a '0' level. Gate tunneling through PR 530, as well as the gate-induced drain leakage (GIDL) and junction leakage of PB 521, still charge SN, while sub-$V_T$ leakage of the turned-off PB 521 counteracts (but does not avoid) the SN charging process.

Memory Array

Figure 9:
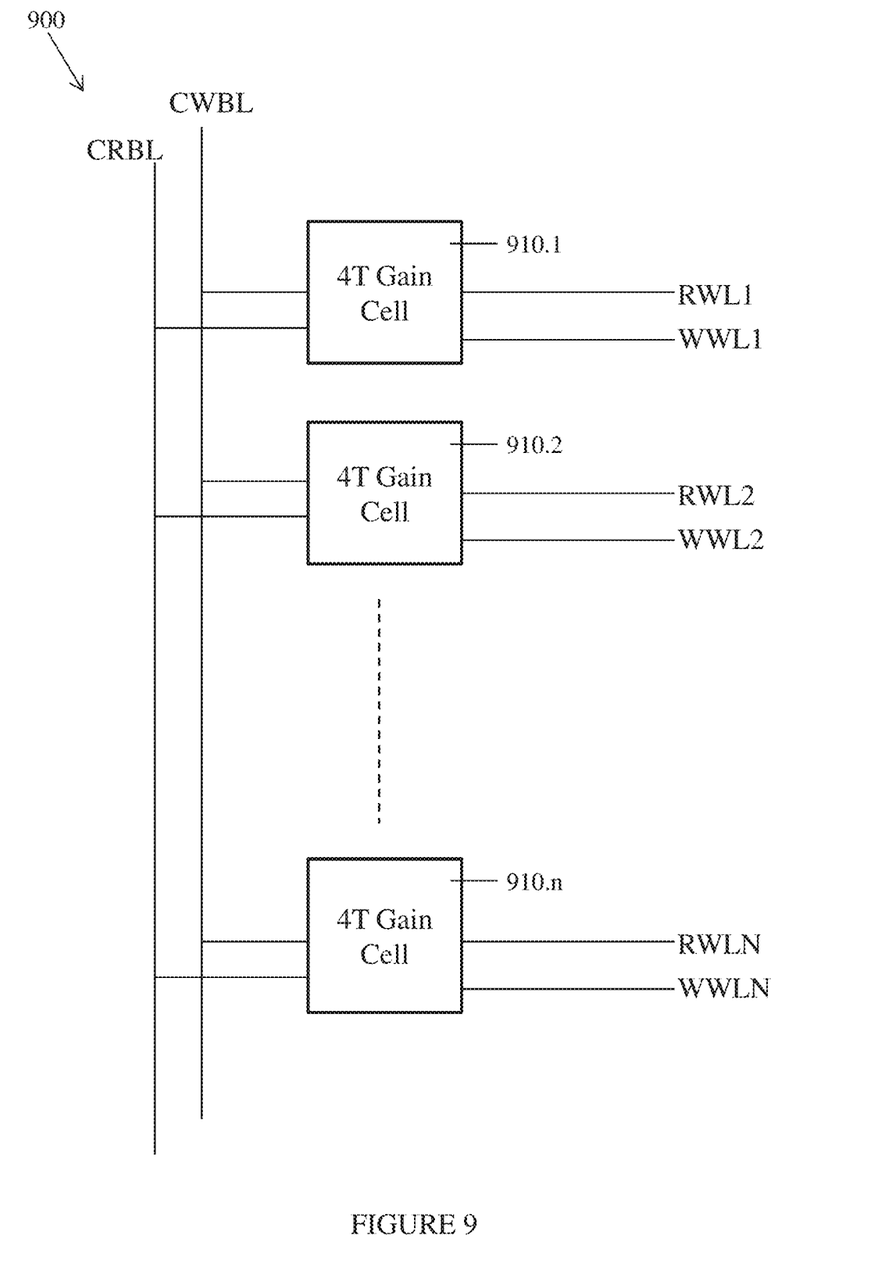
FIG. 9 is a simplified block diagram of a memory array, according to embodiments of the invention.

Reference is now made to FIG. 9 which is a simplified block diagram of a memory array, according to embodiments of the invention.

Memory array 900 includes an array of 4T gain cells 910.1 to 910.n, with respective write trigger inputs (WWL1 to WWLN) and read trigger outputs (RWL1 to RWLN). The write bit lines inputs (WBLs) of the 4T cells in the array are connected together to form a common write bit line (CWBL). Similarly, the read bit line outputs (RBLs) of the 4T cells are connected together to form a common read bit line output (CRBL). This creates a memory array with gain cells that may be written and read in unison. The type of 4T gain cells forming the array may be any one of the embodiments described herein.

Embodiments herein present a DRAM 4T gain cell which may be used for scaled CMOS nodes characterized by high leakage currents, which may be embedded in a GC-eDRAM. The gain cell design protects the weak data level by a conditional, cell-internal feedback path, while the feedback is disabled for the strong data level. The gain cell embodiments require low retention power and improved worst case retention time. This is achieved with a small cell area relative to a 6T SRAM in the same technology, making the embodiments herein an appealing high-density, low-leakage alternative.

It is expected that during the life of a patent maturing from this application many relevant transistor types and transistor technologies will be developed and the scope of the term transistor is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find simulation support in the following examples.

EXAMPLES

Reference is now made to the following examples, which together with the above descriptions illustrate some embodiments of the invention in a non limiting fashion.

The simulation results presented below are for a 64×32 bit (2 kb) memory macro based on the 4T PMOS gain cell 500 of FIG. 5. The memory macro was designed in a low-power CMOS 65 nm process. All devices were implemented with standard $V_T$ transistors to provide logic process compatibility. The operating voltage was selected to be 700 mV in order to demonstrate compatibility with power-aware (near-threshold) applications.

Figure 10:
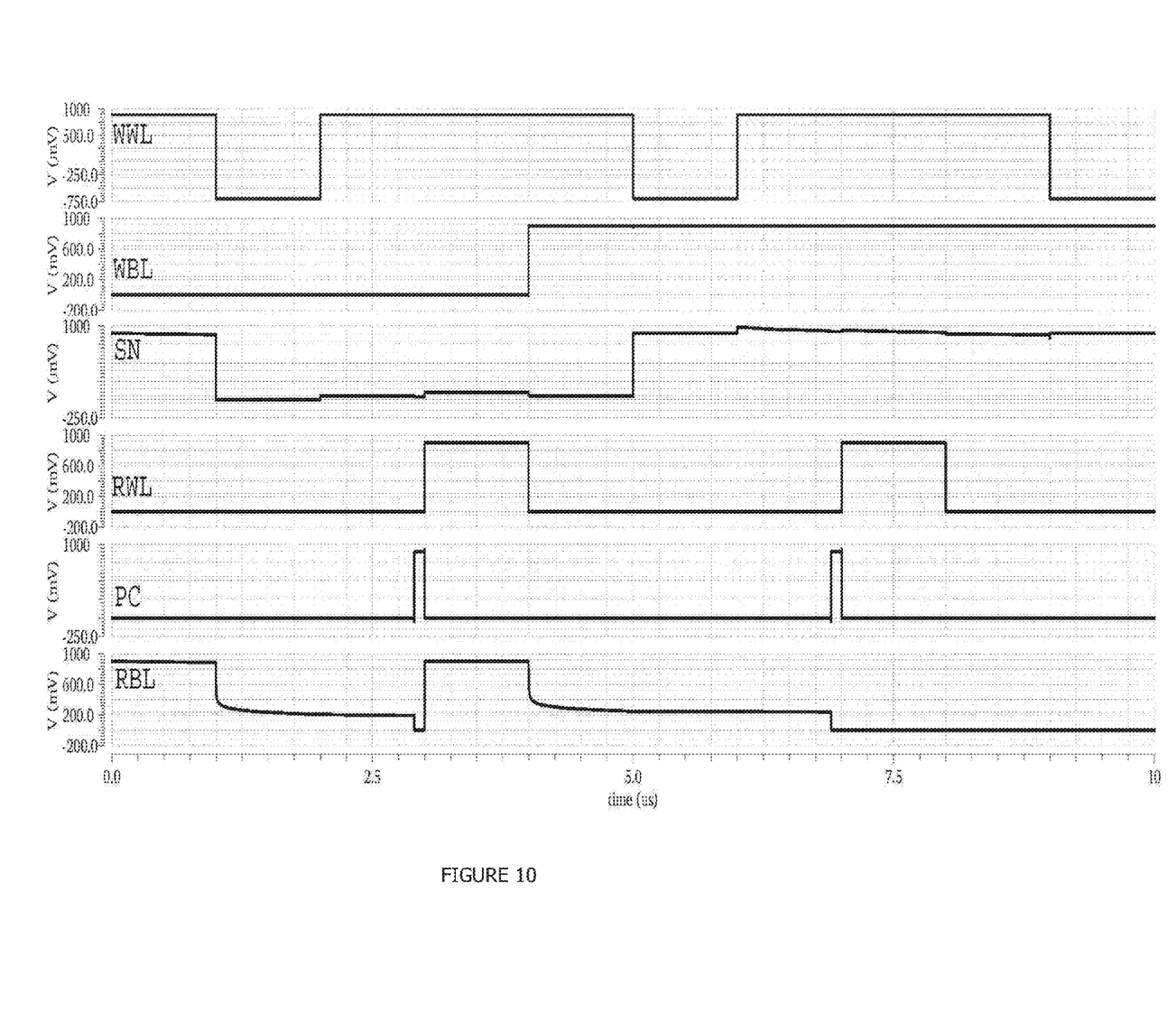
FIG. 10 is a timing diagram demonstrating 4T PMOS gain cell operation, according to embodiments of the invention.

Reference is now made to FIG. 10 which is a timing diagram demonstrating 4T PMOS gain cell operation through subsequent write and read operations.

Initially, a '0' is written to SN by pulsing WWL to a negative voltage (−700 mV), thereby discharging SN through WBL. Next, a read operation is performed by pre-discharging RBL by pulsing the PC control signal (not shown), and subsequently charging RWL. As required, RBL is driven high through PR. Prior to the next assertion of WWL, WBL is driven high in order to write a '1' to SN. During the next read cycle, the pre-discharged RBL remains low, as the stored '1' level blocks the discharge path through PR 530.

Figure 11:
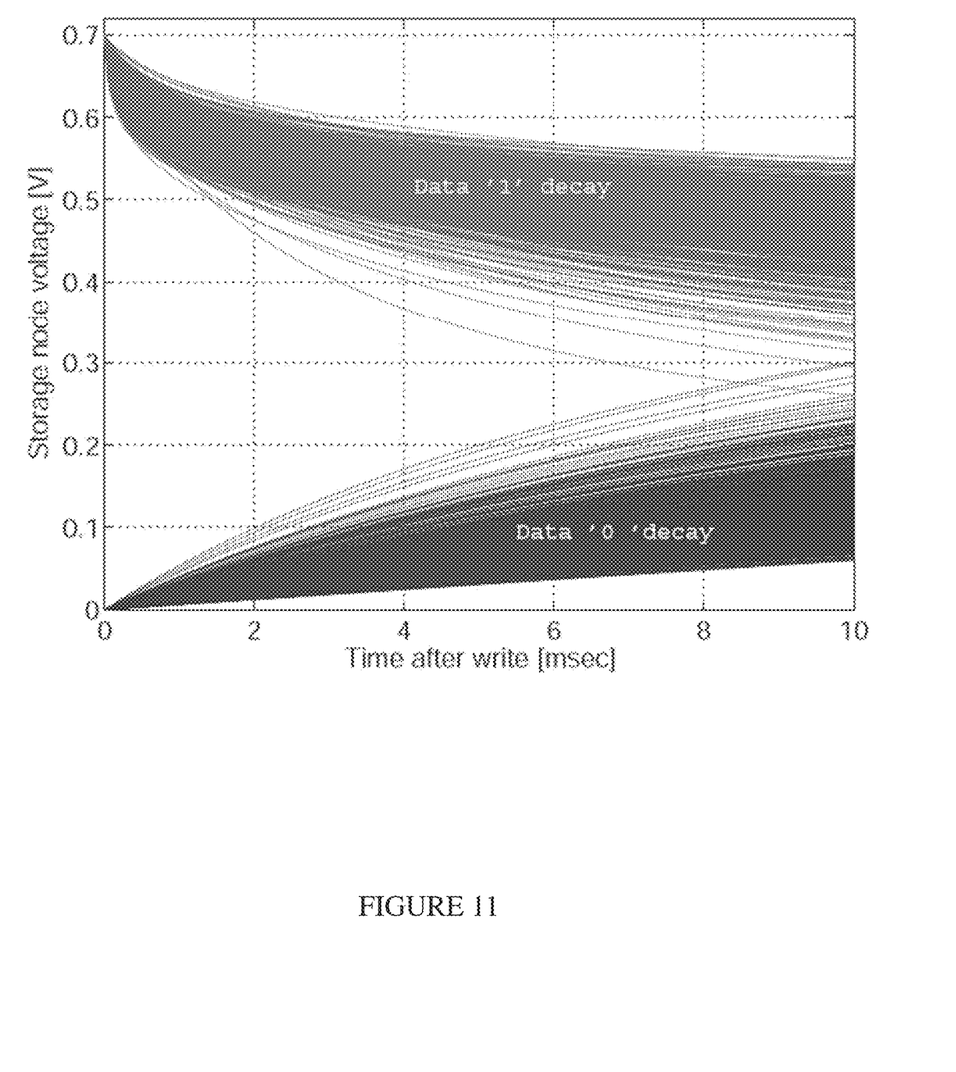
FIG. 11 shows storage node degradation of a 4T PMOS gain cell following a write operation under the worst-case WBL bias conditions, according to embodiments of the invention.

Reference is now made to FIG. 11 shows storage node degradation of a 4T PMOS gain cell following a write operation under the worst-case WBL bias conditions. The results of FIG. 11 may be compared to those presented in FIG. 2 for the 2T PMOS gain cell. 1024 Monte Carlo samples were simulated in a 65 nm CMOS process with a 700 mV supply, driving WBL to the opposite voltage of that stored on SN (similarly to FIG. 2). The level degradation seen in FIG. 11 is not only much more balanced than the extremely asymmetric degradation of the 2T PMOS cell, but it is also more than an order of magnitude higher.

The estimated DRT, extracted from the results shown in FIG. 11, is 8.29 ms at 27 C.° and 3.98 ms at 85 C.°. This is over 3 times higher than the best retention time reported so far in a 65 nm CMOS node [ref. 9]. Moreover, the symmetric behavior of the two data states is more appropriate for differentiating between data '0' and data '1' levels, easing the design of a specific readout circuit and potentially further enhancing the actual retention time (i.e. latest successful read) compared to the 2T PMOS cell.

Chun et al. [ref. 3] previously showed that a standard 2T GC-eDRAM may exhibit lower retention power than a similarly sized SRAM in 65 nm CMOS. Since the retention time of the presented 4T PMOS gain cell is over 40 times higher than that of a standard 2T cell, the retention power (composed of leakage and refresh power) is even lower. For the simulated 4T PMOS gain cell memory macro, the retention power was found to be 3.86 pW/bit at 27 C and 53.78 pW/bit at 85 C. These retention powers are almost 5 times less than the leakage power of a 6T-bitcell SRAM operated at 0.7 V.

Figure 12A:
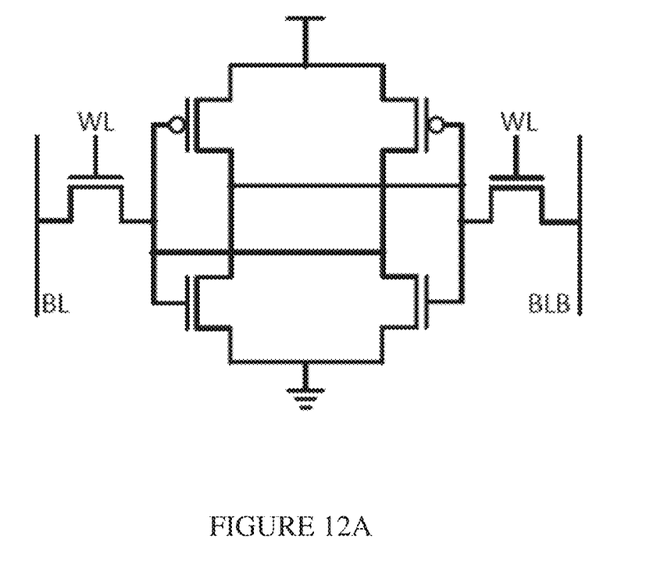
FIGS. 12A-12C are simplified cell structure diagrams of a 6T SRAM, 2T1C gain cell and 2T gain cell respectively.
Figure 12B:
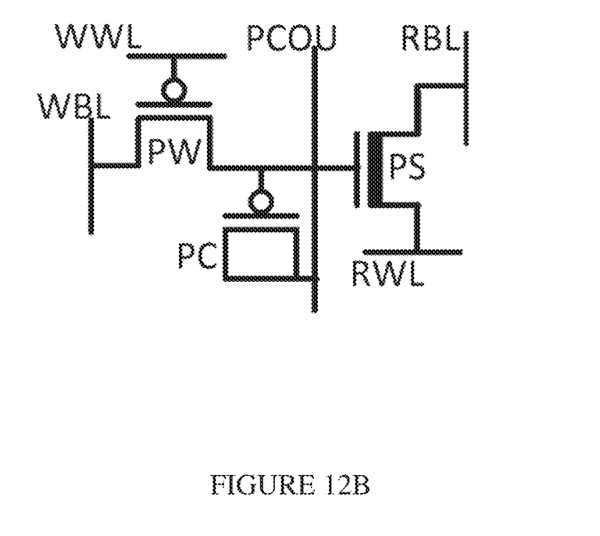
Figure 12C:
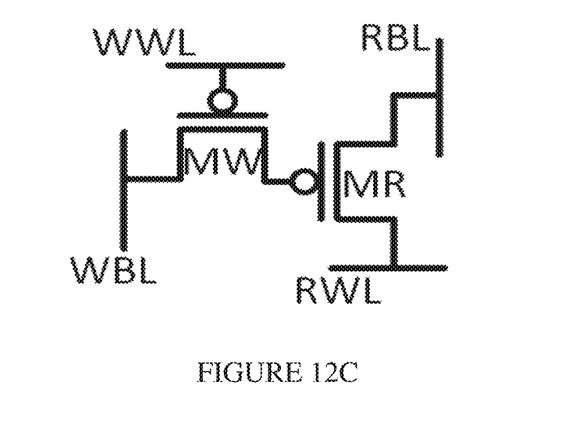

A comparison between the proposed cell and other embedded memories is presented in Table 1. Simplified cell structure diagrams of the 6T SRAM, 2T1C gain cell and 2T gain cell (referred to in Table 1) are shown in FIGS. 12A to 12C respectively.

TABLE 1

| Cell Type | 6T SRAM | 2T1C gain cell | 2T gain cell | 4T PMOS gain cell |
|---|---|---|---|---|
| Drawn Cell Size | 1.18 µm² (1X) | 0.69 µm² (0.58X) | 0.27 µm² (0.23X) | 0.71 µm² (0.6X) |
| Supply Voltage ($V_{DD}$) | 1.1 V | 1.1 V | 1.1 V | 0.7 V |
| Worst Case Retention Time | Static | 0.5 ms @ 85 C. | 10 s @ 85 C. | 3.98 ms @ 85 C. |

TABLE 1-continued

| Cell Type | 6T SRAM | 2T1C gain cell | 2T gain cell | 4T PMOS gain cell |
|---|---|---|---|---|
| Retention Power | 264.58 pW @ 85 C., $V_{DD}$ = 0.7 V; 564.29 pW @ 85 C., $V_{DD}$ = 1.1 V | 158 pW @ 85 C. | 1.95 µW @ 85 C. | 53.78 pW @ 85 C., $V_{DD}$ = 0.7 V; 126.9 pW @ 85 C., $V_{DD}$ = 1.1 V |

Table 1 clearly emphasizes the benefits of the 4T PMOS gain cell, which achieves much lower power usage due to its increased retention time.

Performance of the proposed 4T cell is summarized in Table 2. At 700 mV, the active refresh energy is 6.89 fJ/bit, composed of 5.88 fJ/bit for read and 1.01 fJ/bit for write. The 4T PMOS gain cell has a read delay of 2.32 ns (using a slow but small sense inverter) and a write delay of 0.4 ns (with and underdrive of −700 mV). A conventional 2T gain-cell was measured to have a 0.29 ns write delay, which is the same order of magnitude as the proposed cell.

TABLE 2

| | |
|---|---|
| Technology | 65 nm LP CMOS |
| Cell Area | 0.708 µm² |
| 4T eDRAM/6T SRAM Cell Area Ratio | 0.6 |
| Supply Voltage | 700 mV |
| Worst Case Retention Time | 8.29 ms @ 27 C. 3.98 ms @ 85 C. |
| Write Delay (worst) | 0.4 ns @ 85 C. |
| Read Delay (worst) | 2.32 ns @ 85 C. |
| Active Read Energy | 5.88 fJ/bit @ 85 C. |
| Active Write Energy | 1.01 fJ/bit @ 85 C. |
| Active Refresh Energy | 6.89 fJ/bit @ 85 C. |
| Leakage Power/bit | 2.87 pW @ 27 C. 51.29 pW @ 85 C. |
| Retention Power/bit | 3.86 pW @ 27 C. 53.78 pW @ 85 C. |

Figure 13:
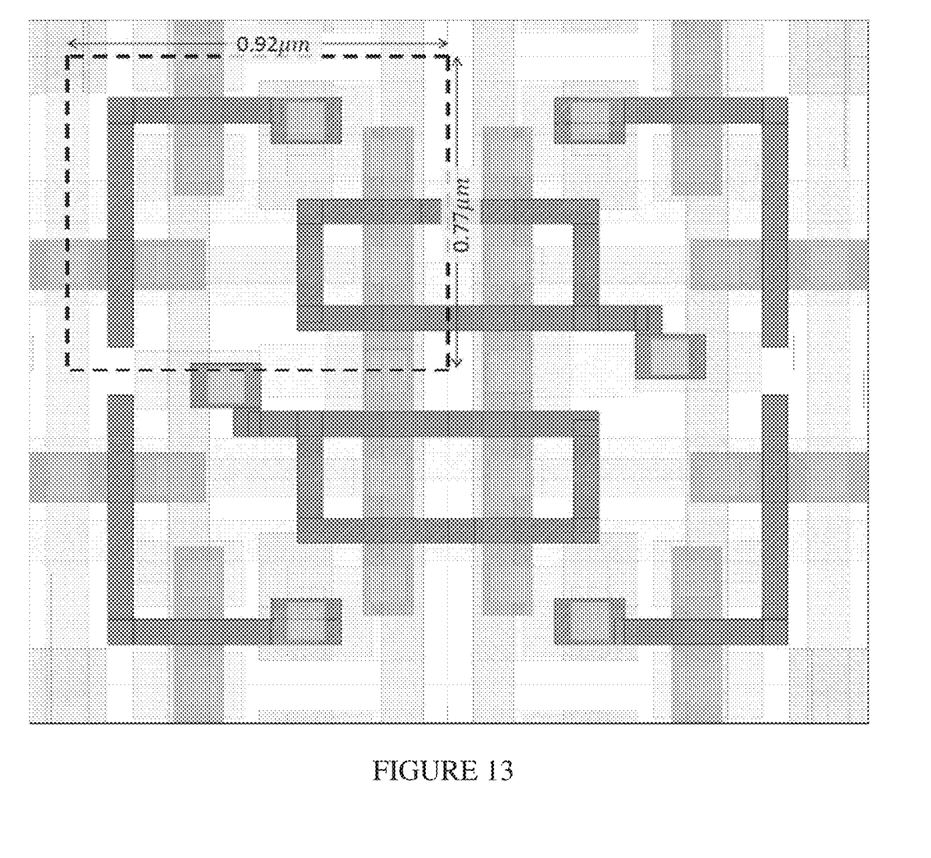
FIG. 13 shows a simplified layout of an exemplary four-transistor GC-eDRAM memory.

Reference is now made to FIG. 13 which shows a simplified layout of an exemplary four-transistor GC-eDRAM memory. The marked dimensions are of a single 4T PMOS gain cell. It is seen that the cell area is 0.92 µm by 0.77 µm.

In summary, simulations of an exemplary embodiment of a four-transistor (4T) GC-eDRAM memory show a threefold increase in retention time, as compared to the best previously proposed gain cell in the same 65 nanometer node technology, or using the same Production Design Kit (PDK) for simulations and/or manufacturing [ref. 7]. The improved retention time results in a factor of ten decrease in retention power (static plus refresh power) as compared to the static power of a 65 nm 6T SRAM [ref. 8]. The improved performance is achieved with a gain cell that is 40% smaller than a 6T SRAM cell in the same technology. This enables the creation of a high density memory array with low power integration.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] International technology roadmap for semiconductors—2012 update," 2012. [Online]. Available: wwwdotitrsdotnet

[2] D. Somasekhar et al., "2 GHz 2 Mb 2T gain cell memory macro with 128 GBytes/sec bandwidth in a 65 nm logic process technology," IEEE JSSC, vol. 44, no. 1, pp. 174-185, 2009.

[3] K. Chun et al., "A 667 MHz logic-compatible embedded DRAM featuring an asymmetric 2T gain cell for high speed on-die caches," IEEE JSSC, 2012.

[4] Y. Lee et al., "A 5.4 nW/kB retention power logic-compatible embedded DRAM with 2T dual-VT gain cell for low power sensing applications," in Proc. IEEE A-SSCC, 2010.

[5] P. Meinerzhagen, A. Teman, R. Giterman, A. Burg, and A. Fish, "Exploration of sub-VT and near-VT 2T gain-cell memories for ultra-low power applications under technology scaling," Journal of Low Power Electronics and Applications, vol. 3, no. 2, pp. 54-72, 2013.

[6] A. Teman, P. Meinerzhagen, A. Burg and A. Fish, "Review and classification of gain cell edram implementations," in Proc. IEEEI. IEEE, 2012, pp. 1-5.

[7] K. C. Chun et al., "A sub-0.9V logic-compatible embedded DRAM with boosted 3T gain cell, regulated bit-line write scheme and PVT-tracking read reference bias," in Proc. IEEE Symposium on VLSI Circuits, 2009.

[8] K. Zhang et al., "A 3-ghz 70 mb sram in 65 nm cmos technology with integrated column-based dynamic power supply," in Proc. IEEE ISSCC, 2005, pp. 474-611 Vol. 1.

[9] K. C. Chun et al., "A 2T1C embedded DRAM macro with no boosted supplies featuring a 7T SRAM based repair and a cell storage monitor," IEEE JSSC, vol. 47, no. 10, pp. 2517-2526, 2012.

What is claimed is:

1. A gain cell, comprising:
   a write bit line input;
   a read bit line output;
   a write trigger input;
   a read trigger input;
   a write transistor, comprising a first diffusion connection, a gate connection, and a second diffusion connection, said first diffusion connection being connected to said write bit line input and said gate connection being connected to said write trigger input;
   a read transistor, comprising a first diffusion connection, a gate connection and a second diffusion connection, said first diffusion connection being connected to said read bit line output and said second diffusion connection being connected to said read trigger input; and
   a retention element associated with said write transistor and said read transistor, configured to buffer between said second diffusion connection of said write transistor and said gate connection of said read transistor during data retention, and to connect said second diffusion connection of said write transistor to a constant voltage during retention of a first data level at said gate connection of said read transistor and to disconnect said second diffusion connection of said write transistor from said constant voltage during retention of a second data level at said gate connection of said read transistor.

2. A gain cell according to claim 1, wherein said retention element is configured to connect said second diffusion connection of said write transistor to said gate connection of said read transistor during a write bit operation, and to disconnect said second diffusion connection of said write transistor from said gate connection of said read transistor during data retention.

3. A gain cell according to claim 1, wherein said retention element comprises:
   a buffer switch, having a buffer input, a buffer output and a buffer control input; and
   a feedback switch associated with said buffer switch, having a feedback input, a feedback output and a feedback control input, wherein said feedback input is connected to a constant voltage;
   said buffer input being connected to said second diffusion connection of said write transistor and to said feedback switch output, and said buffer switch output being connected to said gate connection of said read transistor and to said feedback control input and said write control input being connected to said write trigger input,
   wherein said buffer switch is configured to connect said buffer input to said buffer output when said write trigger is on and to disconnect said buffer input from said buffer output when said write trigger is off, and wherein said feedback switch is configured to connect said feedback input to said feedback output when said feedback control input is at said first data level and to disconnect said feedback input from said feedback output when said feedback control input is at said second data level.

4. A gain cell according to claim 1, wherein said retention element comprises:
   a buffer transistor, having a first diffusion connection, a gate connection connected to said write trigger input, and a second diffusion connection; and
   a feedback transistor, having a first diffusion connection, a gate connection, and a second diffusion connection, wherein said first diffusion connection is connected to a constant voltage;
   said first diffusion connection of said buffer transistor being connected to said second diffusion connection of said write transistor and to said second diffusion connection of said feedback transistor, and said second diffusion connection of said buffer transistor being connected to said gate connection of said read transistor and to said gate connection of said feedback transistor.

5. A gain cell according to claim 4, wherein said feedback transistor comprises a p-type transistor and said constant voltage comprises a low data voltage level.

6. A gain cell according to claim 4, wherein said feedback transistor comprises an n-type transistor and said constant voltage comprises a high data voltage level.

7. A gain cell according to claim 1, further comprising a capacitor between said gate connection of said read transistor and ground.

8. A memory array comprising a plurality of gain cells according to claim 1, wherein respective write bit line inputs of said gain cells are connected to form a common write bit line, and respective read bit line outputs of said gain cells are connected to form a common read bit line output.

9. A gain cell comprising:
a write bit line input;
a read bit line output;
a write trigger input;
a read trigger input;
a write transistor, comprising a first diffusion connection, a gate connection, and a second diffusion connection, said first diffusion connection being connected to said write bit line input and said gate connection being connected to said write trigger input;
a read transistor, comprising a first diffusion connection, a gate connection and a second diffusion connection, said first diffusion connection being connected to said read bit line output and said second diffusion connection being connected to said read trigger input;
a buffer transistor, having a first diffusion connection, a gate connection connected to said write trigger input, and a second diffusion connection; and
a feedback transistor, having a first diffusion connection, a gate connection, and a second diffusion connection, wherein said first diffusion connection is connected to a constant voltage;
said first diffusion connection of said buffer transistor being connected to said second diffusion connection of said write transistor and to said second diffusion connection of said feedback transistor, and said second diffusion connection of said buffer transistor being connected to said gate connection of said read transistor and to said gate connection of said feedback transistor.

10. A gain cell according to claim 9, wherein said write transistor, said buffer transistor said feedback transistor and said read transistor comprise p-type transistors.

11. A gain cell according to claim 9, wherein said write transistor, said buffer transistor, said feedback transistor and said read transistor comprise n-type transistors.

12. A gain cell according to claim 9, wherein said write transistor, said buffer transistor and said feedback transistor comprise p-type transistors and said read transistor comprises an n-type transistor.

13. A gain cell according to claim 9, wherein said write transistor, said buffer transistor and said feedback transistor are n-type transistors and said read transistor comprises a p-type transistor.

14. A memory array comprising a plurality of gain cells according to claim 9, wherein respective write bit line inputs of said gain cells are connected to form a common write bit line input, and respective read trigger inputs of said gain cells are connected to form a common read bit line output.

* * * * *